(12) United States Patent
Annis

(10) Patent No.: US 12,052,839 B2
(45) Date of Patent: Jul. 30, 2024

(54) STIFFENER FOR USE WITH PLUG-IN MODULE

(71) Applicant: TE Connectivity Solutions GmbH, Schaffhausen (CH)

(72) Inventor: Kyle Gary Annis, Hummelstown, PA (US)

(73) Assignee: TE Connectivity Solutions GmbH (CH)

( * ) Notice: Subject to any disclaimer, the term of this patent is extended or adjusted under 35 U.S.C. 154(b) by 0 days.

(21) Appl. No.: 18/051,986

(22) Filed: Nov. 2, 2022

(65) Prior Publication Data
US 2024/0147650 A1 May 2, 2024

(51) Int. Cl.
*H05K 7/14* (2006.01)
(52) U.S. Cl.
CPC .................. *H05K 7/1461* (2013.01)
(58) Field of Classification Search
None
See application file for complete search history.

(56) References Cited

U.S. PATENT DOCUMENTS

| | | | | |
|---|---|---|---|---|
| 4,730,232 A | * | 3/1988 | Lindberg | H05K 7/1461 361/728 |
| 5,909,359 A | * | 6/1999 | Summers | H05K 7/1429 206/706 |
| 6,356,458 B1 | * | 3/2002 | Andreassen | H05K 7/1461 361/752 |
| 6,661,676 B1 | * | 12/2003 | Chen | G06F 1/182 248/407 |
| 2023/0041681 A1 | * | 2/2023 | Guyot | H05K 1/18 |

* cited by examiner

*Primary Examiner* — James Wu
*Assistant Examiner* — Christopher L Augustin

(57) ABSTRACT

A strengthening member for use with a plug-in module assembly includes a planar portion which extends across a width of a portion of a circuit board of the plug-in module assembly. The planar portion has a leading edge which approximately aligns with a leading surface of the circuit board, a trailing edge, and side edges which extend between the leading edge and the trailing edge. First mounting portions extend from the side edges and have first mounting openings. A second mounting portion extends from the trailing edge and has second mounting openings. First mounting hardware is positioned in the first mounting openings. The first mounting hardware cooperates with the first mounting portions and the circuit board. Second mounting hardware is positioned in the second mounting openings. The second mounting hardware cooperates with the second mounting portions, the circuit board and a cover of the plug-in module assembly.

19 Claims, 4 Drawing Sheets

STIFFENER FOR USE WITH PLUG-IN MODULE

FIELD OF THE INVENTION

The present invention is stiffener for use with a plug-in circuit board module. In particular, the invention is directed to a stiffener which improves vibration performance of board to board connectors.

BACKGROUND OF THE INVENTION

It is known to insert plug-in module assemblies into chassis to allow the plug-in module assemblies to be provided in electrical and mechanical contact with a backplane. However, in many applications, there is not a direct line of sight with the slots, making the slots of the chassis difficult to see as the plug-in module assemblies are inserted into the slots of the chassis. This can be caused by the location of the chassis or the density of the plug-in module assemblies positioned in the chassis. Consequently, connectors positioned on the circuit board at the leading end of the plug-in module assemblies may engage the housing of the chassis when insertion occurs, causing damage to the connectors.

It would be, therefore, beneficial to provide a strengthening member or stiffener which would provide mechanical support to the connections and the circuit board to prevent damage thereto and to provide improved vibration performance with the connectors are mated to mating connectors of the backplane.

SUMMARY OF THE INVENTION

An embodiment is directed to a strengthening member for use with a plug-in module assembly. The strengthening member includes a planar portion which extends across a width of a portion of a circuit board of the plug-in module assembly. The planar portion has a leading edge which approximately aligns with a leading surface of the circuit board, a trailing edge, and side edges which extend between the leading edge and the trailing edge. First mounting portions extend from the side edges and have first mounting openings. A second mounting portion extends from the trailing edge and has second mounting openings. First mounting hardware is positioned in the first mounting openings. The first mounting hardware cooperates with the first mounting portions and the circuit board. Second mounting hardware is positioned in the second mounting openings. The second mounting hardware cooperates with the second mounting portions, the circuit board and a cover of the plug-in module assembly.

An embodiment is directed to a plug-in module assembly configured to be inserted into a slot of a chassis. The plug-in module assembly includes a substrate, a frame, a cover and a strengthening member. The substrate has one or more connectors extending from a leading end of the substrate. The frame is positioned on sides of the substrate. The cover extends over the substrate. The strengthening member is provided proximate the leading end of the substrate. The strengthening member includes a planar portion, first mounting portions and first mounting hardware. The planar portion extends across a width of the substrate. The planar portion has a leading edge, a trailing edge and side edges. The leading edge aligns with the leading end of the substrate. The side edges extend between the leading edge and the trailing edge. The planar portion is positioned over through holes in the substrate in which compliant pins of terminals of the one or more connectors are secured. The first mounting portions extend from the side edges and have first mounting openings. The first mounting hardware is positioned in the first mounting openings. The first mounting hardware cooperates with the first mounting portions and the substrate.

An embodiment is directed to a strengthening member for use with a plug-in module assembly. The strengthening member includes a planar portion which extends across a width of a portion of a circuit board of the plug-in module assembly. The planar portion has a leading edge, a trailing edge and side edges. The leading edge is in approximate alignment with a leading surface of the circuit board, a trailing edge. The side edges extend between the leading edge and the trailing edge. Mounting portions extend from one or more of the side edges and trailing edge. The mounting portions have mounting openings with mounting hardware. The planar portion has electrical insulation provided on a surface of the planar portion which faces the circuit board of the plug-in module assembly.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
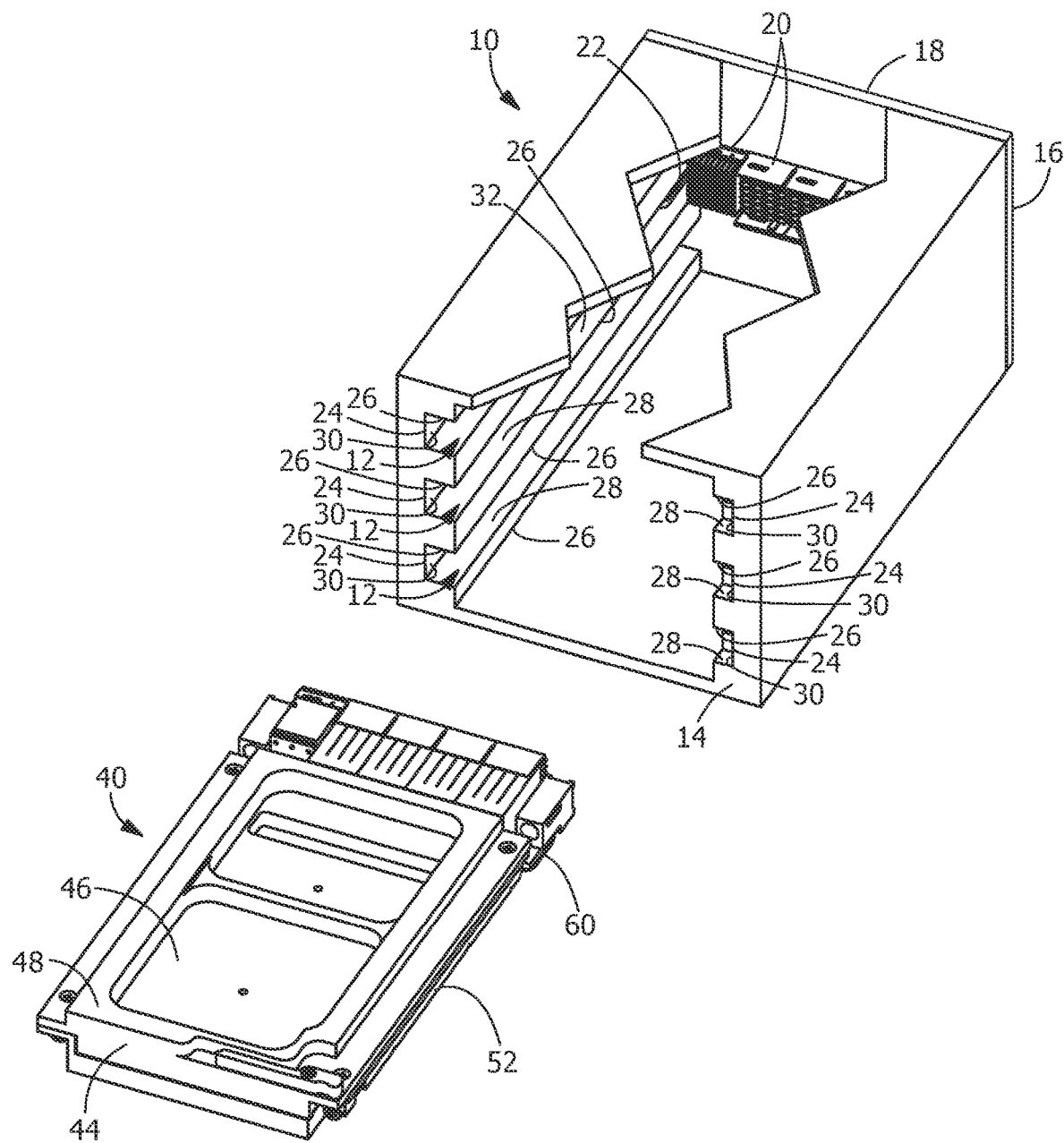
FIG. 1 is a perspective view of a plug-in module assembly prior to insertion into a slot of a chassis.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 3:
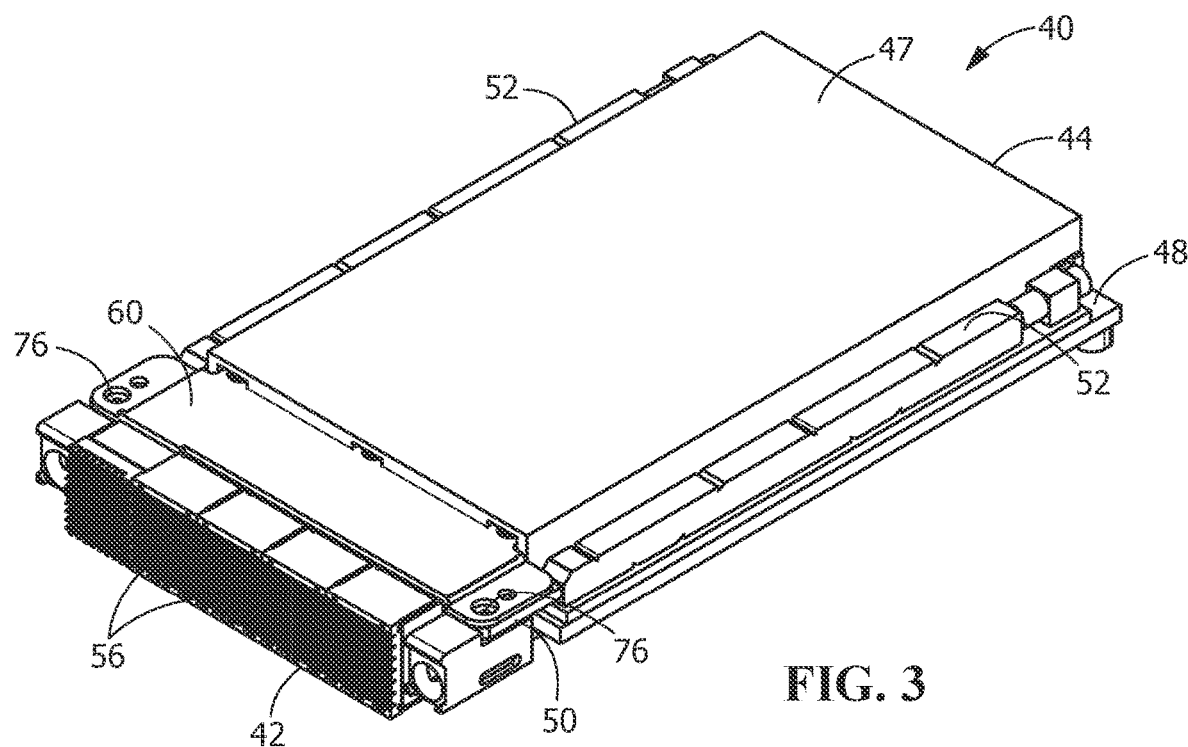
FIG. 3 is a bottom perspective view of the plug-in module assembly of FIG. 1.
Figure 4:
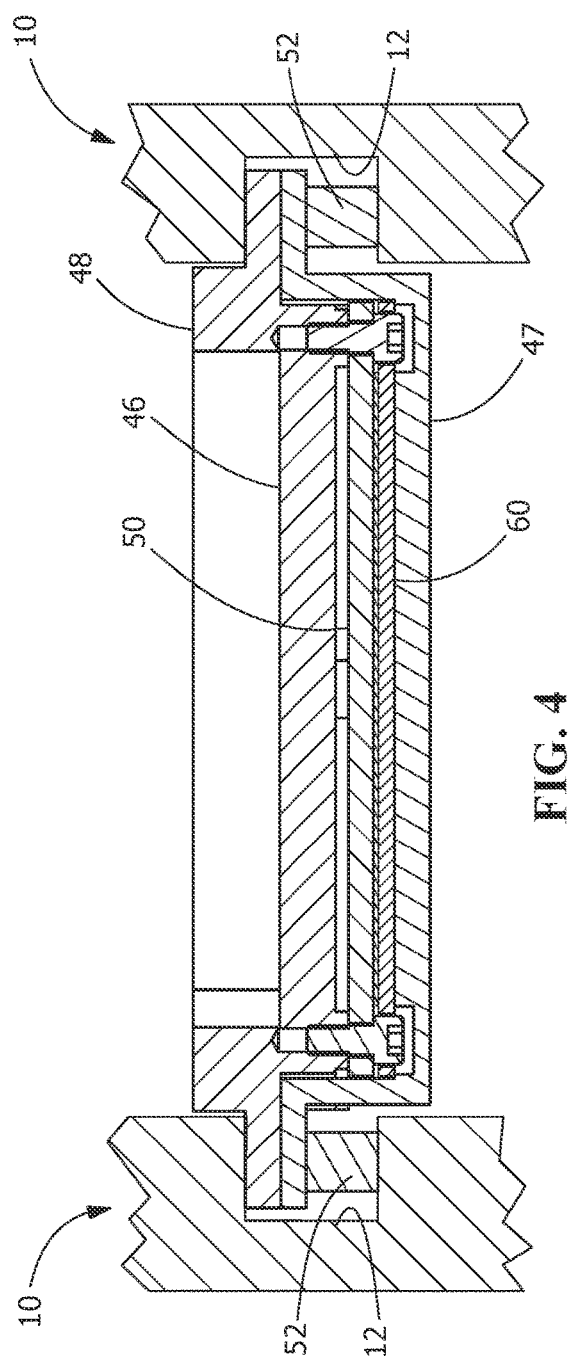
FIG. 4 is a cross-sectional view of the plug-in module assembly when fully inserted into the chassis taken across the width of the plug-in module, shown the plug-in module in electrical and mechanical engagement with the chassis.

As shown in FIG. 3, an illustrative chassis 10 has three slots 12 which extend from a first or mating surface 14 to a second or backplane mounting surface 16. A backplane 18 is mounted to the backplane mounting surface 16. The chassis 10 is meant to be illustrative, as the shape, configuration and number of slots may vary.

The backplane 18 has one or more mating connectors 20 provided thereon. Guideposts 22 extend from the backplane 18 in the same direction as the mating connectors 20. In the illustrative embodiment shown, two guideposts 22 are shown. The backplane 18, mating connectors 20 and guideposts 22 are illustrative and not limiting.

Each of the slots 12 has guide rails 24 positioned on either end thereof. Each of the guide rails 24 has a top wall 26, a bottom wall 28 and an end wall 30 which extends between the top wall 26 and the bottom wall 28. The guide rails 24 are offset from interior side walls 32 of the chassis 10.

Figure 2:
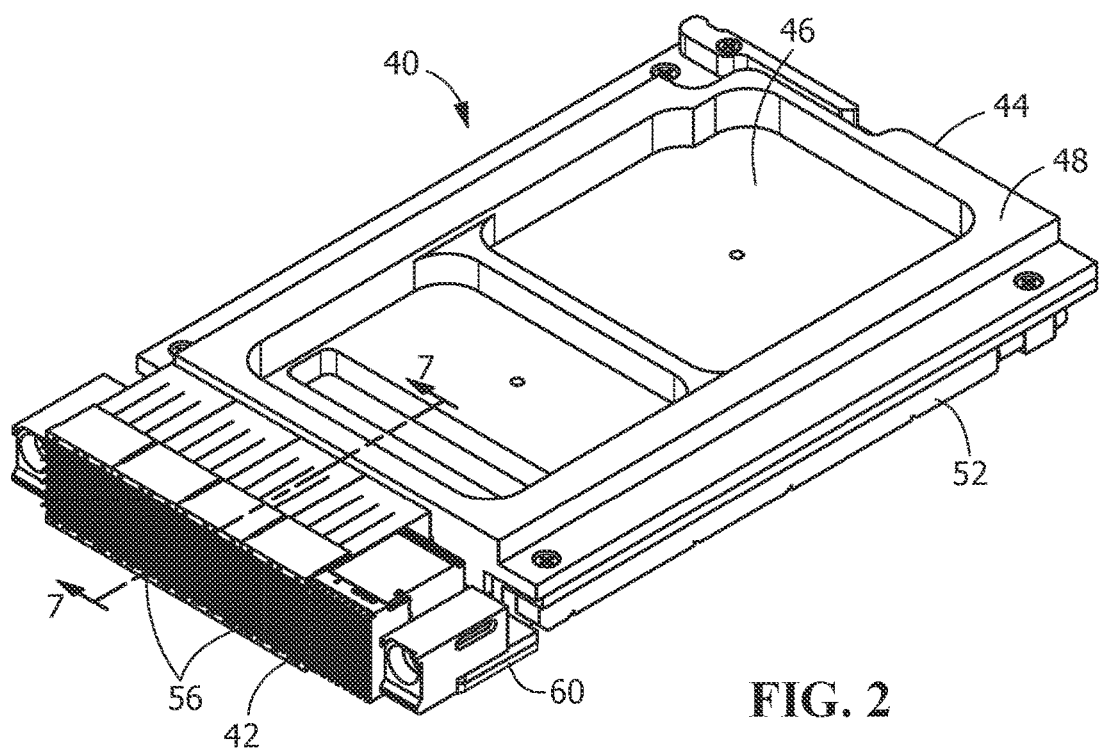
FIG. 2 is a top perspective view of the plug-in module assembly of FIG. 1.

Plug-in module assemblies 40, as shown in FIG. 3, are configured to be inserted into the slots 12. As shown in FIGS. 1 through 3, each plug-in module assembly 40 has a leading or mating edge or end 42 and a trailing edge or end 44. Each plug-in module assembly has a top cover 46, a bottom cover 47, a frame 48, at least one circuit board or substrate 50, retainers 52, one or more connectors 56, one or more guide modules 58 and a strengthening member or stiffener 60.

The retainers 52 may be, but are not limited to, wedge lock assemblies. The one or more connectors 56 extend from the leading end 42 in a direction away from the trailing end 44. The one or more connectors 56 are mechanically and electrically connected to the circuit board 50. The connectors 56 may have power or signal contacts which extend therethrough based on the application in which the plug-in module assemblies 40 are used. The top cover 46, the bottom cover 47, the frame 48, the retainers 52, the one or more ejectors 54, and the one or more connectors 56 are known in the industry, and can be, for example, of the type described in the ANSI/VITA 48.2-2020 standard, which is incorporated herein in its entirety. In the illustrative embodiment shown, the guide modules 58 are of the type shown and described in U.S. patent application Ser. No. 17/494,060 filed on Oct. 5, 2021, which is incorporated herein in its entirety.

The illustrative embodiment of the strengthening member or stiffener 60 is shown with the plug-in module assembly 40, however, the strengthening member or stiffener 60 may be used with other types of assemblies or substrates.

Figure 7:
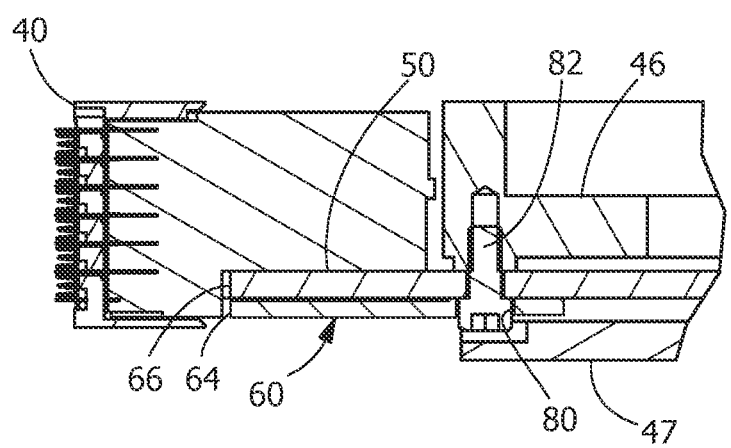
FIG. 7 is a cross-sectional view of the plug-in module assembly taken along line 7-7 of FIG. 2.

The strengthening member 60 has a planar portion 62 which extends across a width of a portion of a circuit board 50 of the plug-in module assembly 40 proximate the leading or mating end 42. A leading edge 64 of the planar portion 62 approximately aligns with a leading surface of 66 the circuit board, as shown in FIG. 7. The planar portion 62 had a trailing edge 68 which opposed to the leading edge 64. Side edges 70 of the planar portion 62 extend between the leading edge 64 and the trailing edge 68. As shown in FIG. 2, the strengthening member 60 extends across surfaces of the one or more connectors 56.

First mounting portions 72 extend from the side edges 70 of the planar portion 62. The first mounting portions 72 have first mounting openings 74. First mounting hardware 76 is positioned in the first mounting openings 74. The first mounting hardware 76 cooperates with the first mounting portions 72, the circuit board 50 and the guide module 58 to retain the strengthening member 60 in position on the circuit board 50 and relative to the plug-in module assembly 40. In the illustrate embodiment shown, the first mounting hardware 76 cooperates with the guide modules 58, however the first mounting hardware 76 may cooperate with other portions of the plug-in module assembly 40. The first mounting hardware 76 may be, but are not limited to, screws or other threaded members. In various embodiments, the first mounting hardware 76 is made of conductive material. The first mounting portions 72 extend in a plane with is offset from the plane of the planar portion 62 of strengthening member 60.

A second mounting portion 78 extends from the trailing edge 68 of the planar portion 62. The second mounting portion 78 has one or more second mounting openings 80. Second mounting hardware 82 is positioned in the second mounting openings 80. The second mounting hardware 80 cooperates with the second mounting portion 78, the circuit board 50 and the top cover 46 of the plug-in module assembly 40. The second mounting hardware 82 may be, but are not limited to, screws or other threaded members. In various embodiments, the second mounting hardware 82 is made of conductive material. The first mounting hardware 76 and the second mounting hardware 82 may be the same or different. The second mounting portion 78 extends in the same plane as the planar portion 62. In the illustrative embodiment shown, the second mounting portion 78 and the first mounting portions 72 extend in the different planes, however, the second mounting portion 62 may be provided in the same plane as the first mounting portions 72.

Figure 5:
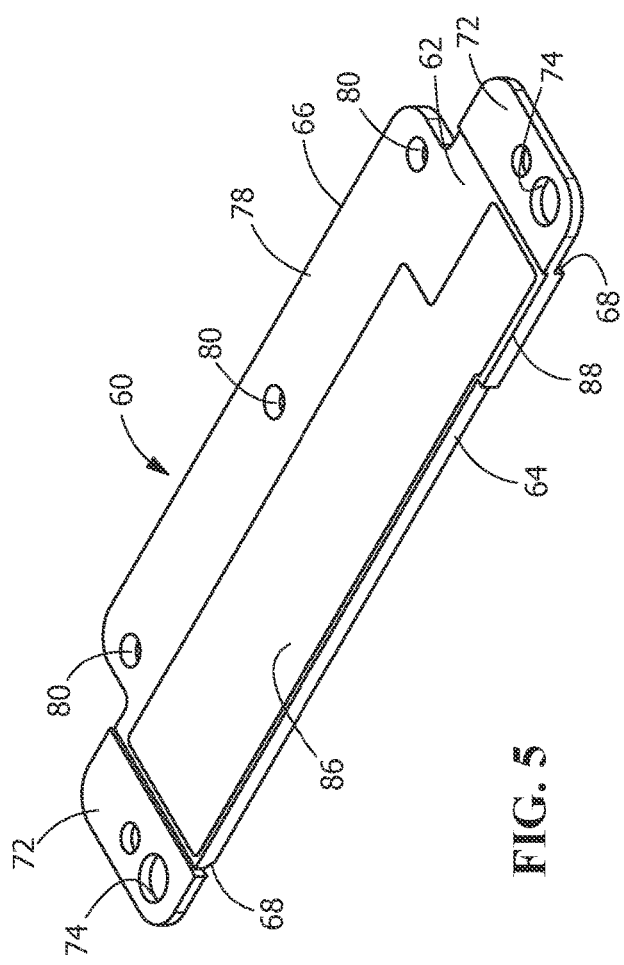
FIG. 5 is a bottom view of a stiffener of the plug-in module assembly.
Figure 6:
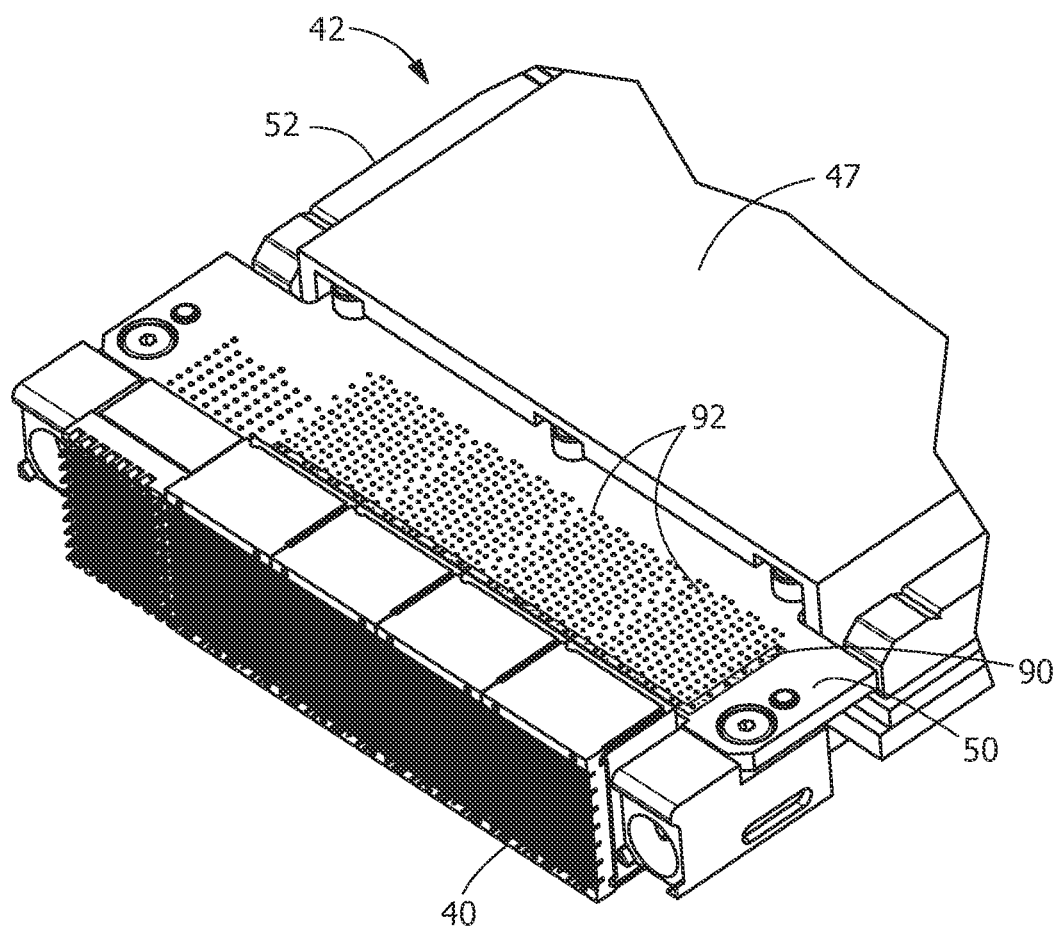
FIG. 6 is a perspective view of the bottom side of the plug-in assembly with the stiffener removed.

As shown in the illustrative embodiment of FIG. 5, a surface 84 of the planar portion 62 which faces the circuit board 50 has electrical insulation 86 provided therein. In the embodiment shown, the strengthening member 60 is made of conductive material and the electrical insulation 86 provides electrical separation between the strengthening member 60 and the circuit board 50 and to reduce the likelihood of shorting between the strengthening member 60 and the mounting areas, such as, but not limited to, plated through holes 92 of the circuit board 50. In alternate embodiments, the plated through holes may be replaced by surface mount connections.

In alternate embodiments, the surface 84 of the planar portion 62 which faces the circuit board 50 has an epoxy. The epoxy may wick into the plated through holes 92 in the circuit board 50 to increase the mechanical hold down strength between the strengthening member 60 and the circuit board 50. The epoxy may also increase the mechanical hold down strength between the circuit board 50 and the connectors 56, as the epoxy will flow into the plated through holes 92 and engage pins (not shown), such as, but not limited to, compliant pins of the terminals of the connectors positioned in the plated through holes 92.

Grounding areas 88 of the strengthening member 60 do not have insulation 86 provided thereon. The grounding areas 88 are configured to be positioned over ground pads or traces 90 provided on the circuit board 50 to allow the grounding areas 88 to be placed in electrical engagement with the ground traces 90, as shown in FIG. 7. Electromagnetic interference (EMI) gaskets (not shown) may be provided to prevent EMI leakage from the through holes 92 of the circuit board 50, thereby enhancing the EMI performance of the plug-in module assembly 40.

When the strengthening member 60 is properly assembled to the circuit board 50 and the mounting hardware 76, 82 is properly secured, the strengthening member 60 cooperates with the circuit board 50 and the plug-in module assembly 40 to provide strength to the circuit board 50, the connectors 56 and the plug-in module assembly 40, thereby reducing the deflection of the circuit board 50 and connectors 56. This improves the vibration performance and reduces motion of the circuit board 50 and the connectors 56 during insertion and use.

When the plug-in module assembly 40 is fully assembled, the second mounting portion 78 is positioned between the bottom cover 47 and the substrate 50. In this position, the second mounting hardware 82 extends through the circuit board 50 to the top 46.

With the second mounting hardware 82 properly secured and the plug-in module assembly 40 properly assembled, a ground path is provided from the circuit board 50 through the ground traces 90 of the circuit board 50, through the grounding areas 88 if the strengthening member 60, through the planar portion 62, through the second mounting portion 78, through the second mounting hardware 82, through the top cover 47, through the retainers 52 and to the chassis 10. Additional ground paths may be provided through the first mounting portions 72, the first mounting hardware 76 and the guide modules 58.

The strengthening member 60 is dimensioned to fit within the dimensional limits of the plug-in module assembly 40 and the chassis 10, to allow for the plug-in module assembly 40 to be inserted into the slots 12 of chassis 10.

While the invention has been described with reference to a preferred embodiment, it will be understood by those skilled in the art that various changes may be made, and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A strengthening member for use with a plug-in module assembly, the strengthening member comprising:
  a planar portion extending across a width of a portion of a circuit board of the plug-in module assembly, the planar portion having a leading edge which approximately aligns with a leading surface of the circuit board, a trailing edge, and side edges extending between the leading edge and the trailing edge, the planar portion having epoxy provided on a surface of the planar portion which faces the circuit board of the plug-in module assembly;
  first mounting portions extending from the side edges, the first mounting portions having first mounting openings;
  a second mounting portion extending from the trailing edge, the second mounting portion having second mounting openings;
  first mounting hardware positioned in the first mounting openings, the first mounting hardware cooperating with the first mounting portions and the circuit board;
  second mounting hardware positioned in the second mounting openings, the second mounting hardware cooperating with the second mounting portion, the circuit board and a cover of the plug-in module assembly.

2. The strengthening member as recited in claim 1, wherein the second mounting portion extends in a different plane than the planar portion.

3. The strengthening member as recited in claim 2, wherein the first mounting portions extend in a different plane than the planar portion.

4. The strengthening member as recited in claim 3, wherein the second mounting portion extends in the same plane as the first mounting portions.

5. The strengthening member as recited in claim 1, wherein the planar portion has electrical insulation provided on a surface of the planar portion which faces the circuit board of the plug-in module assembly.

6. The strengthening member as recited in claim 1, wherein the strengthening member is made of conductive material.

7. The strengthening member as recited in claim 6, wherein a ground path is provided from the strengthening member through the second mounting hardware and the cover to a chassis in which the plug-in module assembly is inserted.

8. A plug-in module assembly configured to be inserted into a slot of a chassis, the plug-in module assembly comprising;
  a substrate with one or more connectors extending from a leading end of the substrate;
  a frame positioned on sides of the substrate;
  a cover extending over the substrate;
  a strengthening member provided proximate the leading end of the substrate, the strengthening member comprising:
  a planar portion extending across a width of the substrate, the planar portion having a leading edge, a trailing edge and side edges, the leading edge aligning with the leading end of the substrate, the side edges extending between the leading edge and the trailing edge, the planar portion positioned over mounting areas in the substrate in which terminals of the one or more connectors are secured;
  first mounting portions extending from the side edges, the first mounting portions having first mounting openings;
  first mounting hardware positioned in the first mounting openings, the first mounting hardware cooperating with the first mounting portions and the substrate.

9. The plug-in module assembly as recited in claim 8 wherein a second mounting portion extends from the trailing edge, the second mounting portion having second mounting openings, second mounting hardware positioned in the second mounting openings, the second mounting hardware cooperating with the second mounting portion, the substrate and the cover.

10. The plug-in module assembly as recited in claim 9, wherein the cover has a first cover and a second cover, the second mounting portion is positioned between the second cover and the substrate, the second mounting hardware cooperates with the second mounting portion, the substrate and the first cover.

11. The plug-in module assembly as recited in claim 9, wherein the strengthening member is made of conductive material.

12. The plug-in module assembly as recited in claim 11, wherein a ground path is provided from the strengthening member through the second mounting hardware and the cover to the chassis.

13. The plug-in module assembly as recited in claim 9, wherein the second mounting portion extends in a different plane than the planar portion.

14. The plug-in module assembly as recited in claim 13, wherein the first mounting portions extend in a different plane than the planar portion.

15. The plug-in module assembly as recited in claim 14, wherein the second mounting portion extends in the same plane as the first mounting portions.

16. The plug-in module assembly as recited in claim 11, wherein the planar portion has electrical insulation provided on a surface of the planar portion which faces the substrate of the plug-in module assembly.

17. The plug-in module assembly as recited in claim 11, wherein the planar portion has epoxy provided on a surface of the planar portion which faces the substrate of the plug-in module assembly.

18. The plug-in module assembly as recited in claim 11, wherein the substrate is a printed circuit board with ground pads exposed on a surface of the printed circuit board which faces the strengthening member, wherein a ground path is provided from ground pads through the strengthening member, the second mounting hardware and the cover to the chassis, wherein electromagnetic interference leakage from the through holes of the printed circuit board reduced.

19. A strengthening member for use with a plug-in module assembly, the strengthening member comprising:

a planar portion extending across a width of a portion of a circuit board of the plug-in module assembly, the planar portion having a leading edge which approximately aligns with a leading surface of the circuit board, a trailing edge, and side edges extending between the leading edge and the trailing edge;

mounting portions extending from one or more of the side edges and trailing edge, the mounting portions having mounting openings;

mounting hardware positioned in the mounting openings;

the planar portion having electrical insulation provided on a surface of the planar portion which faces the circuit board of the plug-in module assembly.

* * * * *